United States Patent
Judge

(10) Patent No.: US 8,408,773 B2
(45) Date of Patent: *Apr. 2, 2013

(54) LIGHT FOR VEHICLES

(75) Inventor: Michael K. Judge, Livonia, MI (US)

(73) Assignee: Innotec Corporation, Zeeland, MI (US)

( * ) Notice: Subject to any disclaimer, the term of this patent is extended or adjusted under 35 U.S.C. 154(b) by 314 days.

This patent is subject to a terminal disclaimer.

(21) Appl. No.: 12/754,866

(22) Filed: Apr. 6, 2010

(65) Prior Publication Data

US 2010/0186214 A1 Jul. 29, 2010

Related U.S. Application Data

(63) Continuation-in-part of application No. 12/051,512, filed on Mar. 19, 2008, now Pat. No. 7,712,933.

(60) Provisional application No. 60/895,609, filed on Mar. 19, 2007.

(51) Int. Cl.
*F21V 13/00* (2006.01)

(52) U.S. Cl. .......... 362/605; 362/606; 362/618

(58) Field of Classification Search .......... 362/605, 362/606, 612, 618, 481, 488, 495, 97.1
See application file for complete search history.

(56) References Cited

U.S. PATENT DOCUMENTS

| | | | |
|---|---|---|---|
| 1,515,717 A | 11/1924 | Ayotte | |
| 2,254,962 A | 9/1941 | Harris et al. | |
| 3,456,043 A | 7/1969 | Emery | |
| 3,541,488 A | 11/1970 | Odson | |
| 4,041,301 A | 8/1977 | Pelchat | |
| 4,173,035 A | 10/1979 | Hoyt | |
| 4,211,955 A | 7/1980 | Ray | |
| 4,267,559 A | 5/1981 | Johnson et al. | |
| 4,277,819 A | 7/1981 | Sobota et al. | |
| 4,453,903 A | 6/1984 | Pukaite | |
| 4,544,991 A | 10/1985 | Gorsuch | |
| 4,645,970 A | 2/1987 | Murphy | |
| 4,733,335 A | 3/1988 | Serizawa et al. | |
| 4,744,011 A | 5/1988 | Tomita et al. | |
| 4,764,645 A | 8/1988 | Takasawa | |
| 4,788,630 A | 11/1988 | Gavagan | |
| 4,794,431 A | 12/1988 | Park | |
| 4,819,136 A | 4/1989 | Ramsey | |
| 4,857,483 A | 8/1989 | Steffen et al. | |
| 4,860,436 A | 8/1989 | Hirabayashi et al. | |
| 4,885,663 A | 12/1989 | Parker | |

(Continued)

FOREIGN PATENT DOCUMENTS

| | | |
|---|---|---|
| DE | 39 16 875 A1 | 12/1990 |
| DE | 298 11 417 | 10/1998 |

(Continued)

OTHER PUBLICATIONS

Korean Intellectual Property Office, "International Search Report," International Application No. US2008/086521 Jul. 23, 2009 (3 Pages).

(Continued)

*Primary Examiner* — David V Bruce
(74) *Attorney, Agent, or Firm* — Price Heneveld LLP

(57) ABSTRACT

An illuminated component for motor vehicles and the like includes a light source that may comprise one or more LEDs. A sheet of light-transmitting material has a first side surface that is coated with ink or other opaque material. Some of the opaque material is removed to form areas that may be illuminated by the light source. The opaque material may be removed utilizing a laser-engraving/etching process according to a specific pattern or design provided by a customer from a remote location.

16 Claims, 9 Drawing Sheets

U.S. PATENT DOCUMENTS

| | | |
|---|---|---|
| 4,886,960 A | 12/1989 | Molyneux et al. |
| 4,897,771 A | 1/1990 | Parker |
| 4,907,132 A | 3/1990 | Parker |
| 4,935,665 A | 6/1990 | Murata |
| 4,948,242 A | 8/1990 | Desmond et al. |
| 4,954,308 A | 9/1990 | Yabe et al. |
| 4,965,933 A | 10/1990 | Mraz et al. |
| 4,965,950 A | 10/1990 | Yamada |
| 4,985,810 A | 1/1991 | Ramsey |
| 5,036,248 A | 7/1991 | McEwan et al. |
| 5,038,255 A | 8/1991 | Nishihashi et al. |
| 5,070,219 A | 12/1991 | Grosskrueger et al. |
| 5,119,174 A | 6/1992 | Chen |
| 5,136,483 A | 8/1992 | Schoniger et al. |
| 5,160,200 A | 11/1992 | Cheselske |
| 5,160,201 A | 11/1992 | Wrobel |
| 5,161,872 A | 11/1992 | Sasaki et al. |
| 5,178,448 A | 1/1993 | Adams et al. |
| 5,182,032 A | 1/1993 | Dickiet et al. |
| 5,193,895 A | 3/1993 | Naruke et al. |
| 5,203,060 A | 4/1993 | Mraz et al. |
| 5,228,223 A | 7/1993 | Lan |
| 5,236,374 A | 8/1993 | Leonard et al. |
| 5,239,406 A | 8/1993 | Lynam |
| 5,241,457 A | 8/1993 | Sasajima |
| 5,249,104 A | 9/1993 | Mizobe |
| 5,285,060 A | 2/1994 | Larson et al. |
| 5,297,010 A | 3/1994 | Camarota et al. |
| 5,313,729 A | 5/1994 | Sakai et al. |
| 5,325,271 A | 6/1994 | Hutchisson |
| 5,325,275 A | 6/1994 | Liu |
| 5,334,539 A | 8/1994 | Shinar et al. |
| 5,337,225 A | 8/1994 | Brookman |
| 5,355,245 A | 10/1994 | Lynam |
| 5,371,659 A | 12/1994 | Pastrick et al. |
| 5,382,811 A | 1/1995 | Takahashi |
| 5,404,282 A | 4/1995 | Klinke et al. |
| 5,430,627 A | 7/1995 | Nagano |
| 5,463,280 A | 10/1995 | Johnson |
| 5,467,627 A | 11/1995 | Smith et al. |
| 5,497,305 A | 3/1996 | Pastrick et al. |
| 5,497,306 A | 3/1996 | Pastrick |
| 5,499,170 A | 3/1996 | Gagne |
| 5,527,743 A | 6/1996 | Variot |
| 5,530,240 A | 6/1996 | Larson et al. |
| 5,563,422 A | 10/1996 | Nakamura et al. |
| 5,567,036 A | 10/1996 | Theobald et al. |
| 5,568,964 A | 10/1996 | Parker et al. |
| 5,570,272 A | 10/1996 | Variot |
| 5,572,812 A | 11/1996 | Mastuoka |
| 5,578,839 A | 11/1996 | Nakamura et al. |
| 5,613,751 A | 3/1997 | Parker et al. |
| 5,617,297 A | 4/1997 | Lo et al. |
| 5,618,096 A | 4/1997 | Parker et al. |
| 5,632,551 A | 5/1997 | Roney et al. |
| 5,641,221 A | 6/1997 | Schindele et al. |
| 5,649,756 A | 7/1997 | Adams et al. |
| 5,652,434 A | 7/1997 | Nakamura et al. |
| 5,669,698 A | 9/1997 | Veldman et al. |
| 5,669,699 A | 9/1997 | Pastrick et al. |
| 5,669,704 A | 9/1997 | Pastrick |
| 5,671,996 A | 9/1997 | Bos et al. |
| 5,673,994 A | 10/1997 | Fant, Jr. et al. |
| 5,680,245 A | 10/1997 | Lynam |
| 5,708,428 A | 1/1998 | Phillips |
| 5,722,281 A | 3/1998 | Yasuda et al. |
| 5,734,182 A | 3/1998 | Nakamura et al. |
| 5,746,497 A | 5/1998 | Machida |
| 5,747,832 A | 5/1998 | Nakamura et al. |
| 5,752,766 A | 5/1998 | Bailey et al. |
| 5,765,940 A | 6/1998 | Levy et al. |
| 5,786,665 A | 7/1998 | Ohtsuki et al. |
| 5,803,579 A | 9/1998 | Turnbull et al. |
| 5,806,965 A | 9/1998 | Deese |
| 5,848,837 A | 12/1998 | Gustafson |
| 5,868,116 A | 2/1999 | Betts et al. |
| 5,876,107 A | 3/1999 | Parker et al. |
| 5,877,558 A | 3/1999 | Nakamura et al. |
| 5,880,486 A | 3/1999 | Nakamura et al. |
| 5,894,686 A | 4/1999 | Parker et al. |
| 5,895,115 A | 4/1999 | Parker et al. |
| 5,909,037 A | 6/1999 | Rajkomar et al. |
| 5,915,830 A | 6/1999 | Dickson et al. |
| 5,921,652 A | 7/1999 | Parker et al. |
| 5,921,660 A | 7/1999 | Yu |
| 5,927,845 A | 7/1999 | Gustafson et al. |
| 5,934,798 A | 8/1999 | Roller et al. |
| 5,938,321 A | 8/1999 | Bos et al. |
| 5,944,414 A | 8/1999 | Nishitani et al. |
| 5,945,688 A | 8/1999 | Kasahara et al. |
| 5,947,588 A | 9/1999 | Huang |
| 5,951,349 A | 9/1999 | Larose et al. |
| 5,998,925 A | 12/1999 | Shimizu et al. |
| 6,000,287 A | 12/1999 | Menzel |
| 6,005,210 A | 12/1999 | Chien |
| 6,030,089 A | 2/2000 | Parker et al. |
| 6,045,240 A | 4/2000 | Hockstein |
| 6,049,463 A | 4/2000 | O'Malley et al. |
| 6,070,998 A | 6/2000 | Jennings et al. |
| 6,079,838 A | 6/2000 | Parker et al. |
| 6,082,870 A | 7/2000 | George |
| 6,097,501 A | 8/2000 | Hayashi et al. |
| 6,113,247 A | 9/2000 | Adams et al. |
| 6,113,248 A | 9/2000 | Mistopoulos et al. |
| 6,124,886 A | 9/2000 | DeLine et al. |
| 6,139,172 A | 10/2000 | Bos et al. |
| 6,152,575 A | 11/2000 | Montanino |
| 6,152,590 A | 11/2000 | Furst et al. |
| 6,158,867 A | 12/2000 | Parker et al. |
| 6,158,882 A | 12/2000 | Bischoff, Jr. |
| 6,162,381 A | 12/2000 | Onishi et al. |
| 6,164,805 A | 12/2000 | Hulse |
| 6,170,313 B1 | 1/2001 | Vasseur et al. |
| 6,190,026 B1 | 2/2001 | Moore |
| 6,204,512 B1 | 3/2001 | Nakamura et al. |
| 6,215,133 B1 | 4/2001 | Nakamura et al. |
| 6,220,722 B1 | 4/2001 | Begemann |
| 6,234,648 B1 | 5/2001 | Borner et al. |
| 6,244,734 B1 | 6/2001 | Hulse |
| 6,255,613 B1 | 7/2001 | Yang |
| 6,276,822 B1 | 8/2001 | Bedrosian et al. |
| 6,283,612 B1 | 9/2001 | Hunter |
| 6,347,880 B1 | 2/2002 | Furst et al. |
| 6,347,881 B1 | 2/2002 | Serizawa et al. |
| 6,357,902 B1 | 3/2002 | Horowitz |
| 6,371,636 B1 | 4/2002 | Wesson |
| 6,402,570 B2 | 6/2002 | Soga et al. |
| 6,404,131 B1 | 6/2002 | Kawano et al. |
| 6,412,973 B1 | 7/2002 | Bos et al. |
| 6,419,306 B2 * | 7/2002 | Sano et al. .................. 362/495 |
| 6,461,017 B2 | 10/2002 | Selkee |
| 6,469,323 B1 | 10/2002 | Nakamura et al. |
| 6,483,623 B1 | 11/2002 | Maruyama |
| 6,531,324 B2 | 3/2003 | Hsu et al. |
| 6,531,328 B1 | 3/2003 | Chen |
| 6,536,923 B1 | 3/2003 | Merz |
| 6,580,228 B1 | 6/2003 | Chen et al. |
| 6,583,550 B2 | 6/2003 | Iwasa et al. |
| 6,595,671 B2 | 7/2003 | Lefebvre et al. |
| 6,598,996 B1 | 7/2003 | Lodhie |
| 6,604,834 B2 | 8/2003 | Kalana |
| 6,616,313 B2 | 9/2003 | Furst et al. |
| 6,617,786 B1 | 9/2003 | Centofante |
| 6,653,572 B2 | 11/2003 | Ishiwa et al. |
| 6,659,632 B2 | 12/2003 | Chen |
| 6,669,267 B1 | 12/2003 | Lynham et al. |
| 6,673,292 B1 | 1/2004 | Gustafson et al. |
| 6,682,331 B1 | 1/2004 | Peh et al. |
| 6,683,250 B2 | 1/2004 | Luettgen et al. |
| 6,709,132 B2 | 3/2004 | Ishibashi |
| 6,709,137 B1 | 3/2004 | Glovak et al. |
| 6,724,543 B1 | 4/2004 | Chinniah et al. |
| 6,726,502 B1 | 4/2004 | Hayes |
| 6,729,055 B2 | 5/2004 | Chou |
| 6,739,733 B1 | 5/2004 | Lamke et al. |
| 6,739,744 B2 | 5/2004 | Williams et al. |
| 6,755,547 B2 | 6/2004 | Parker |

| | | | | | | |
|---|---|---|---|---|---|---|
| 6,757,969 B1 | 7/2004 | Chan | | 2002/0105812 A1 | 8/2002 | Zimmermann et al. |
| 6,786,625 B2 | 9/2004 | Wesson | | 2002/0108843 A1* | 8/2002 | Reinhardt et al. ............ 200/314 |
| 6,793,371 B2 | 9/2004 | Lamke et al. | | 2002/0131261 A1* | 9/2002 | Inui et al. ........................ 362/31 |
| 6,793,374 B2 | 9/2004 | Begemann | | 2003/0160256 A1 | 8/2003 | Durocher et al. |
| 6,812,481 B2 | 11/2004 | Matsumura et al. | | 2004/0056265 A1 | 3/2004 | Arndt et al. |
| 6,814,474 B2 | 11/2004 | Groeller | | 2004/0114367 A1 | 6/2004 | Li |
| 6,828,170 B2 | 12/2004 | Roberts et al. | | 2004/0180459 A1 | 9/2004 | Hsu |
| 6,848,818 B2 | 2/2005 | Huizenga | | 2004/0214618 A1* | 10/2004 | Hutchison et al. ......... 455/575.1 |
| 6,860,628 B2 | 3/2005 | Robertson et al. | | 2004/0223328 A1 | 11/2004 | Lee et al. |
| 6,866,394 B1 | 3/2005 | Hutchins et al. | | 2004/0252501 A1 | 12/2004 | Moriyama et al. |
| 6,874,925 B2 | 4/2005 | Page et al. | | 2004/0265512 A1 | 12/2004 | Aengenheyster et al. |
| 6,889,456 B2 | 5/2005 | Shibata et al. | | 2005/0007759 A1 | 1/2005 | Parker |
| 6,899,449 B2 | 5/2005 | Hatagishi et al. | | 2005/0032259 A1 | 2/2005 | Nakajima et al. |
| 6,907,643 B2 | 6/2005 | Koops et al. | | 2005/0039512 A1 | 2/2005 | Lefevere |
| 6,910,783 B2 | 6/2005 | Mezei et al. | | 2005/0117352 A1 | 6/2005 | Lin |
| 6,919,629 B2 | 7/2005 | Merado | | 2005/0121829 A1 | 6/2005 | Spurr et al. |
| 6,921,926 B2 | 7/2005 | Hsu | | 2005/0200045 A1 | 9/2005 | Hunkeler |
| 6,930,332 B2 | 8/2005 | Hashimoto et al. | | 2005/0206040 A1 | 9/2005 | Mercado |
| 6,942,360 B2 | 9/2005 | Chou et al. | | 2005/0207176 A1 | 9/2005 | Johnson et al. |
| 6,949,709 B1 | 9/2005 | Barat et al. | | 2005/0210672 A1 | 9/2005 | Reynolds et al. |
| 6,971,758 B2 | 12/2005 | Inui et al. | | 2005/0213351 A1 | 9/2005 | Yang |
| 6,979,100 B2 | 12/2005 | Reiff et al. | | 2005/0214968 A1 | 9/2005 | Waitl et al. |
| 6,982,518 B2 | 1/2006 | Chou et al. | | 2005/0269587 A1 | 12/2005 | Loh et al. |
| 6,988,819 B2 | 1/2006 | Siktbert et al. | | 2005/0286840 A1 | 12/2005 | Ho et al. |
| 6,997,576 B1 | 2/2006 | Lodhie et al. | | 2006/0040094 A1 | 2/2006 | Mizuno et al. |
| 7,040,779 B2 | 5/2006 | Lamke et al. | | 2006/0043607 A1 | 3/2006 | Matsuura et al. |
| 7,048,423 B2 | 5/2006 | Stepanenko et al. | | 2006/0120085 A1 | 6/2006 | Hsieh et al. |
| 7,055,997 B2 | 6/2006 | Baek | | 2006/0157725 A1 | 7/2006 | Flaherty |
| 7,060,542 B2 | 6/2006 | Nakajima et al. | | 2006/0187652 A1 | 8/2006 | Doyle |
| 7,070,304 B2 | 7/2006 | Imai | | 2006/0198155 A1 | 9/2006 | Nickola et al. |
| 7,071,523 B2 | 7/2006 | Yano et al. | | 2006/0215422 A1 | 9/2006 | Laizure, Jr. et al. |
| 7,080,446 B2 | 7/2006 | Baba et al. | | 2006/0220049 A1 | 10/2006 | Flaherty et al. |
| 7,081,644 B2 | 7/2006 | Flaherty et al. | | 2006/0239037 A1 | 10/2006 | Repetto et al. |
| 7,083,311 B2 | 8/2006 | Schreck et al. | | 2006/0245188 A1 | 11/2006 | Takenada |
| 7,086,756 B2 | 8/2006 | Maxik | | 2006/0245191 A1 | 11/2006 | Ratcliffe |
| 7,102,213 B2 | 9/2006 | Sorg | | 2006/0274554 A1 | 12/2006 | Parker |
| 7,114,830 B2 | 10/2006 | Robertson et al. | | 2007/0029569 A1 | 2/2007 | Andrews |
| 7,118,646 B2 | 10/2006 | Henkeler | | 2007/0075451 A1 | 4/2007 | Winter et al. |
| 7,119,422 B2 | 10/2006 | Chin | | 2007/0080357 A1 | 4/2007 | Ishii |
| 7,128,442 B2 | 10/2006 | Lee et al. | | 2007/0097683 A1 | 5/2007 | Chikugawa |
| 7,140,751 B2 | 11/2006 | Lin | | 2007/0103901 A1 | 5/2007 | Reid |
| 7,160,015 B2 | 1/2007 | Parker | | 2007/0103902 A1 | 5/2007 | Hsiao |
| 7,172,314 B2 | 2/2007 | Currie et al. | | 2007/0117248 A1 | 5/2007 | Kunze et al. |
| 7,175,324 B2 | 2/2007 | Kwon | | 2007/0121326 A1 | 5/2007 | Nall et al. |
| 7,195,381 B2 | 3/2007 | Lynam et al. | | 2007/0133214 A1 | 6/2007 | Maeda et al. |
| 7,199,438 B2 | 4/2007 | Appelt et al. | | 2007/0153503 A1 | 7/2007 | Feng |
| 7,213,952 B2 | 5/2007 | Iwai | | 2007/0153549 A1 | 7/2007 | Parker |
| 7,220,029 B2 | 5/2007 | Bynum | | 2007/0166866 A1 | 7/2007 | Appelt et al. |
| 7,224,001 B2 | 5/2007 | Cao | | 2007/0187710 A1 | 8/2007 | Steen et al. |
| 7,226,189 B2 | 6/2007 | Lee et al. | | 2007/0194333 A1 | 8/2007 | Son |
| 7,241,031 B2 | 7/2007 | Sloan et al. | | 2007/0194336 A1 | 8/2007 | Shin et al. |
| 7,249,869 B2 | 7/2007 | Takahashi et al. | | 2007/0194337 A1 | 8/2007 | Kondo |
| 7,262,489 B2 | 8/2007 | Shoji | | 2007/0196762 A1 | 8/2007 | Maeda et al. |
| 7,267,407 B1 | 9/2007 | Demick et al. | | 2007/0200127 A1 | 8/2007 | Andrews et al. |
| 7,268,368 B1 | 9/2007 | Knapp | | 2007/0205425 A1 | 9/2007 | Harada |
| 7,270,454 B2 | 9/2007 | Amano | | 2007/0217192 A1 | 9/2007 | Hiratsuka |
| 7,280,288 B2 | 10/2007 | Loh et al. | | 2007/0241357 A1 | 10/2007 | Yan |
| 7,282,785 B2 | 10/2007 | Yoshida | | 2007/0241362 A1 | 10/2007 | Han et al. |
| 7,301,176 B2 | 11/2007 | Abe et al. | | 2007/0257398 A1 | 11/2007 | Moncrieff |
| 7,333,257 B2 | 2/2008 | Reynolds et al. | | 2007/0259576 A1 | 11/2007 | Brandt et al. |
| 7,357,525 B2 | 4/2008 | Doyle | | 2007/0274648 A1 | 11/2007 | Ip |
| 7,365,322 B2 | 4/2008 | Miyamoto et al. | | 2008/0062711 A1 | 3/2008 | Veenstra et al. |
| 7,374,305 B2 | 5/2008 | Parker | | 2008/0066355 A1 | 3/2008 | Misawa et al. |
| 7,380,961 B2 | 6/2008 | Moriyama et al. | | 2008/0076589 A1 | 3/2008 | Tomomori |
| 7,384,177 B2 | 6/2008 | Parker | | 2008/0102726 A2 | 5/2008 | Jeganathan et al. |
| 7,384,817 B2 | 6/2008 | Takiar et al. | | 2008/0106187 A1 | 5/2008 | Suzuki et al. |
| 7,387,420 B2 | 6/2008 | Ogino et al. | | 2008/0170405 A1 | 7/2008 | Kamiya et al. |
| 7,402,270 B2 | 7/2008 | Mercado | | 2008/0259642 A1 | 10/2008 | Parker |
| 7,434,974 B2 | 10/2008 | Parker | | 2009/0297090 A1 | 12/2009 | Bogner et al. |
| 7,448,778 B2 | 11/2008 | Lin | | | | |
| 7,467,887 B2 | 12/2008 | Parker | | FOREIGN PATENT DOCUMENTS | | |
| 7,712,933 B2 * | 5/2010 | Fleischmann et al. ........ 362/511 | | DE | 198 05 771 | 8/1999 |
| 7,815,339 B2 | 10/2010 | Veenstra et al. | | DE | 102005048497 | 4/2007 |
| 7,837,359 B2 | 11/2010 | Danek et al. | | EP | 1657758 | 5/2006 |
| 8,004,860 B2 | 8/2011 | Salzman | | GB | 2431764 | 5/2007 |
| 2002/0003700 A1 | 1/2002 | Selkee | | JP | 63292690 | 11/1988 |
| 2002/0004251 A1 | 1/2002 | Roberts et al. | | JP | 2058892 | 2/1990 |
| 2002/0060489 A1 | 5/2002 | Richard | | JP | 9-129077 | 5/1997 |
| 2002/0089849 A1 | 7/2002 | Lamke et al. | | JP | 11220239 | 8/1999 |

| | | |
|---|---|---|
| JP | 2002096680 | 4/2002 |
| JP | 2002287671 | 10/2002 |
| JP | 2003243712 | 8/2003 |
| JP | 2005134789 | 5/2005 |
| JP | 2005221661 | 8/2005 |
| JP | 2006062431 | 3/2006 |
| JP | 2007-203873 | 8/2007 |
| JP | 2008070697 | 3/2008 |
| KR | 2000/0009857 | 2/2000 |
| TW | 200702591 | 1/2007 |
| WO | 97/48134 | 12/1997 |
| WO | 97/50132 | 12/1997 |
| WO | 00/55685 | 9/2000 |
| WO | 00/55914 | 9/2000 |
| WO | 2006059828 | 6/2006 |
| WO | 2007036207 | 4/2007 |
| WO | 2007064701 | 6/2007 |
| WO | 2008024761 | 2/2008 |
| WO | 2009076579 | 6/2009 |

OTHER PUBLICATIONS

HOWSTUFFWORKS, "Inside a Light Emitting Diode," 2002 (1 page).

International Search Report, International Application No. PCT/2008/076859, filed Sep. 18, 2008 (4 pages).

* cited by examiner

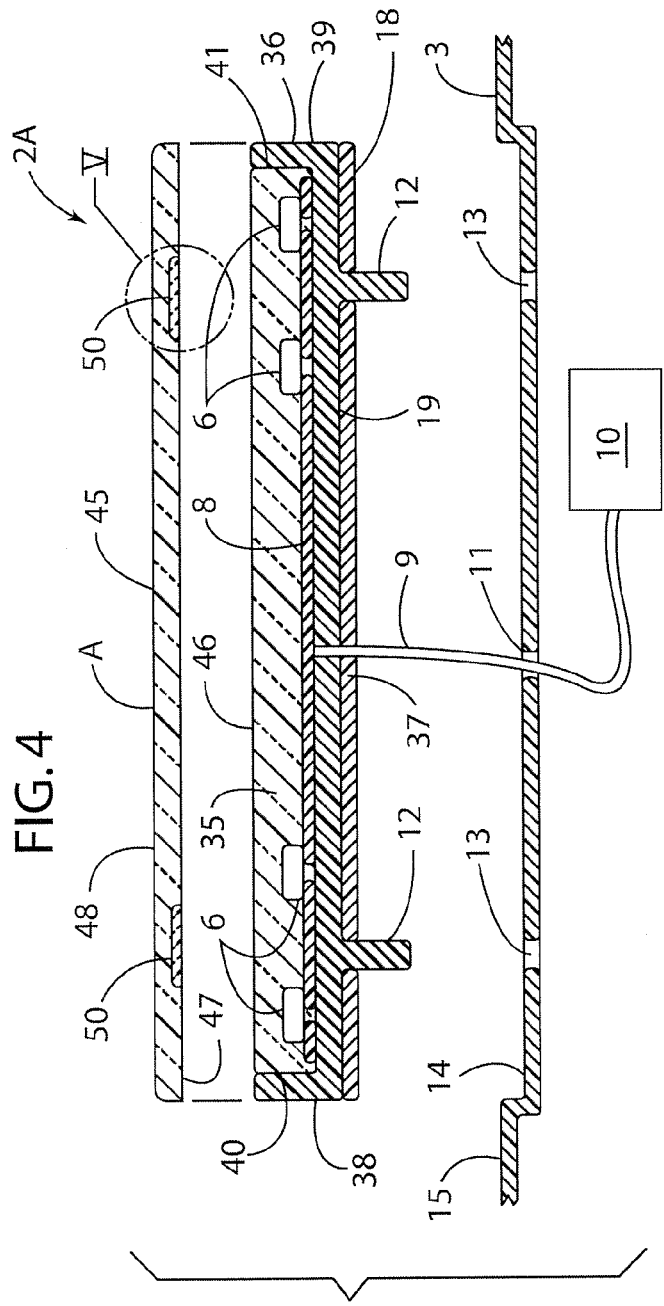

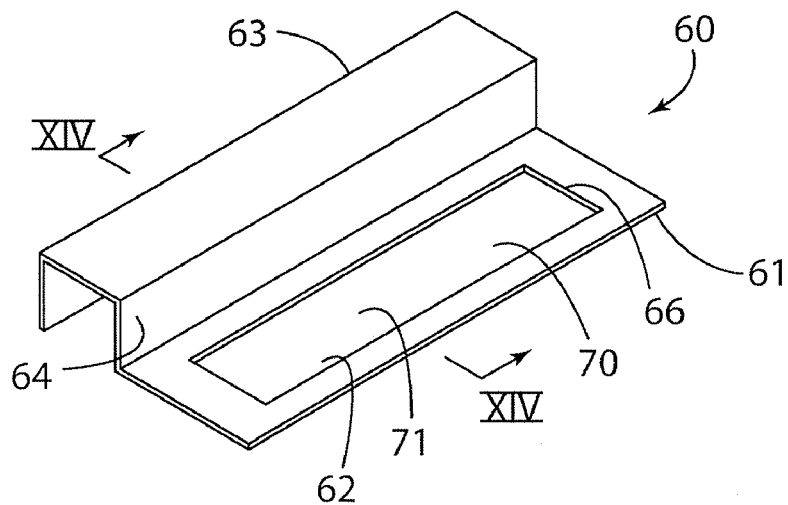
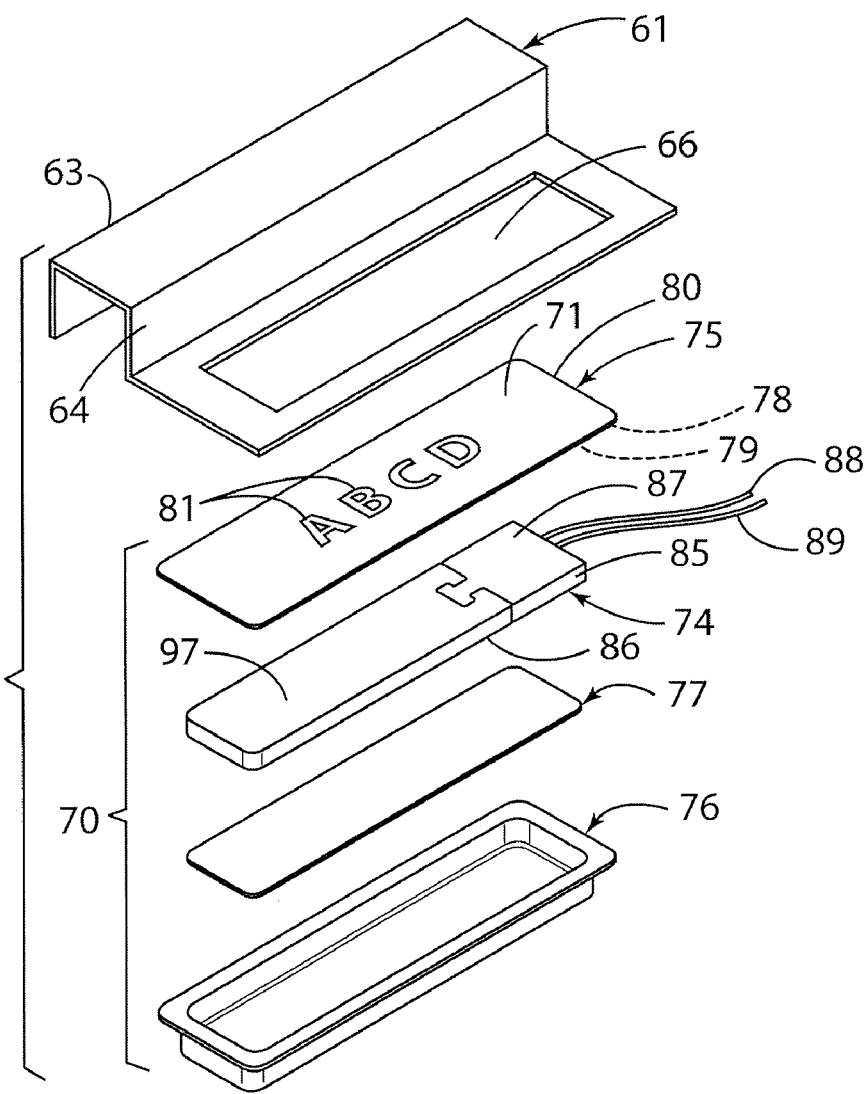

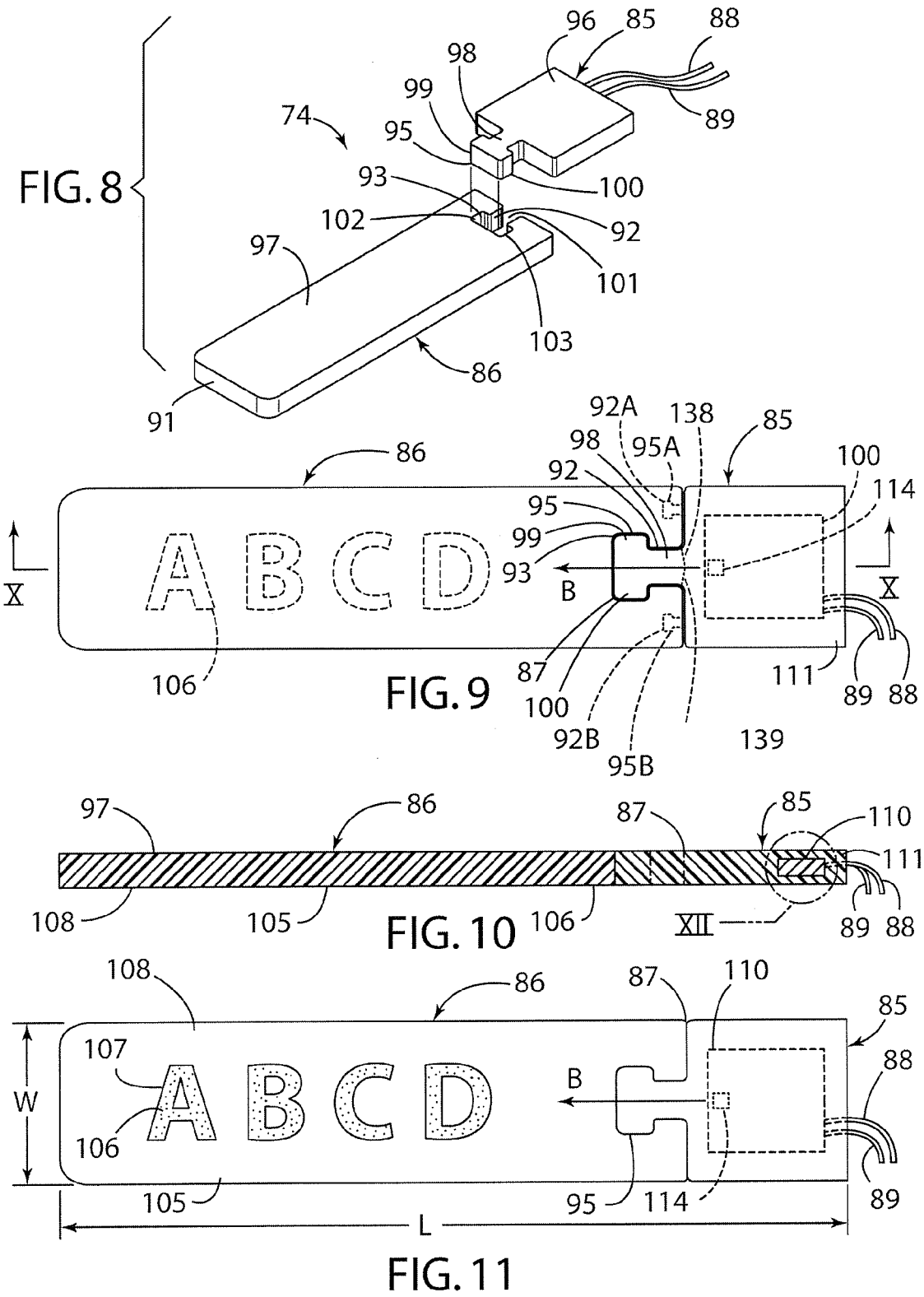

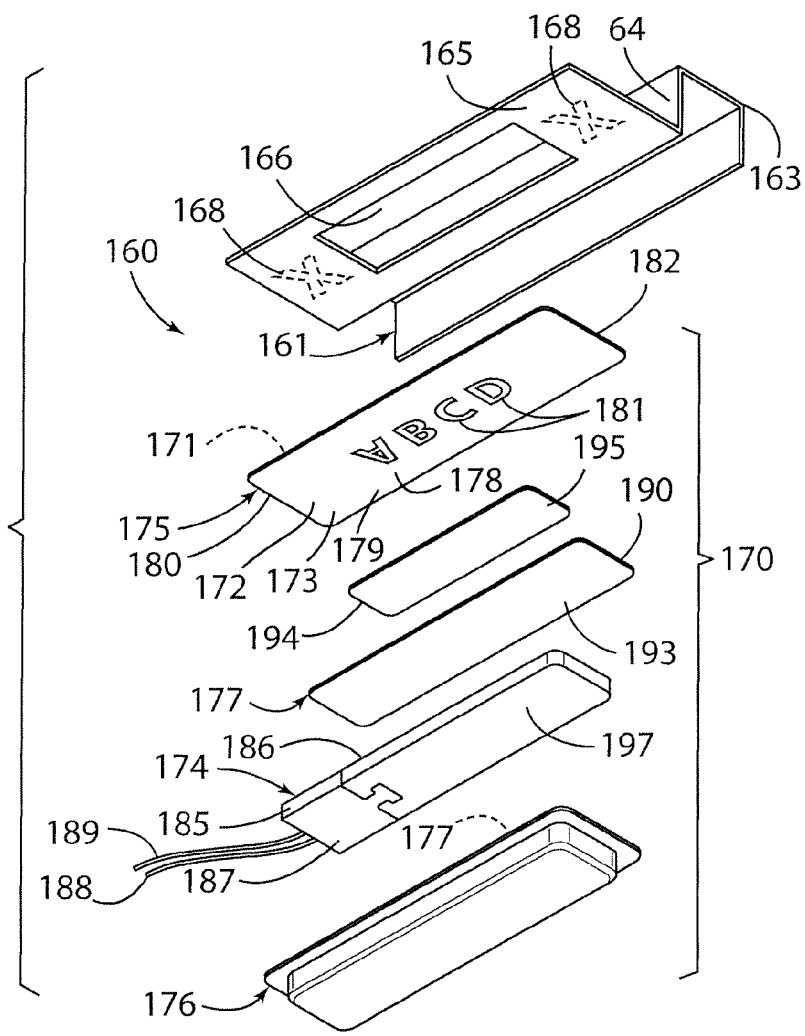
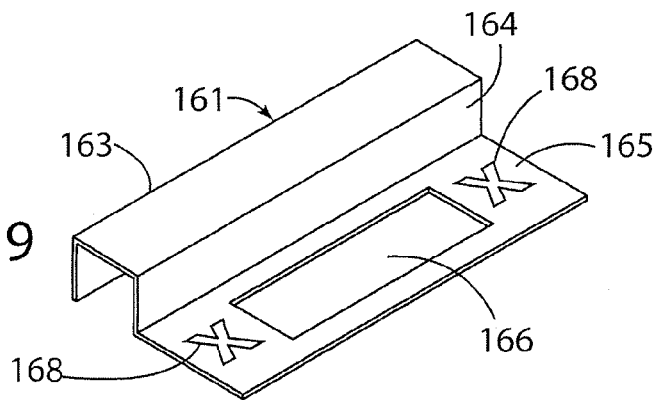
FIG. 18
FIG. 19

LIGHT FOR VEHICLES

CROSS-REFERENCE TO RELATED APPLICATIONS

This application is a continuation-in-part of U.S. Pat. No. 7,712,933, issued on May 11, 2010, entitled LIGHT FOR VEHICLES, which claims the benefit of U.S. Provisional Application No. 60/895,609, filed on Mar. 19, 2007, entitled LIGHTED BADGE OR EMBLEM. The entire contents of each of the above-identified applications is incorporated herein by reference.

BRIEF DESCRIPTION OF THE DRAWINGS

FIG. 1;

FIG. 4 is a partially exploded, fragmentary, cross-sectional view of a badge or emblem according to yet another aspect of the present invention;

FIG. 5 is an enlarged fragmentary view of a portion of the badge or emblem of FIG. 4;

FIG. 6 is a isometric view of a light assembly and doorsill according to another aspect of the present invention;

FIG. 7 is an exploded isometric view of the lighted doorsill assembly of FIG. 6;

FIG. 8 is an exploded isometric view of the light guide and light source of FIG. 7;

FIG. 9 is a top plan view of the light guide and light source assembly of FIG. 8;

FIG. 10 is a cross-sectional view of the light guide and light source assembly of FIG. 9, taken along the line X-X;

FIG. 11 is a bottom plan view of the light guide and light source assembly of FIG. 10;

FIG. 18 is an exploded isometric view of a door sill assembly according to another aspect of the present invention; and FIG. 19 is an isometric view of a portion of the door sill assembly of FIG. 18.

DETAILED DESCRIPTION OF PREFERRED EMBODIMENT

Figure 2:
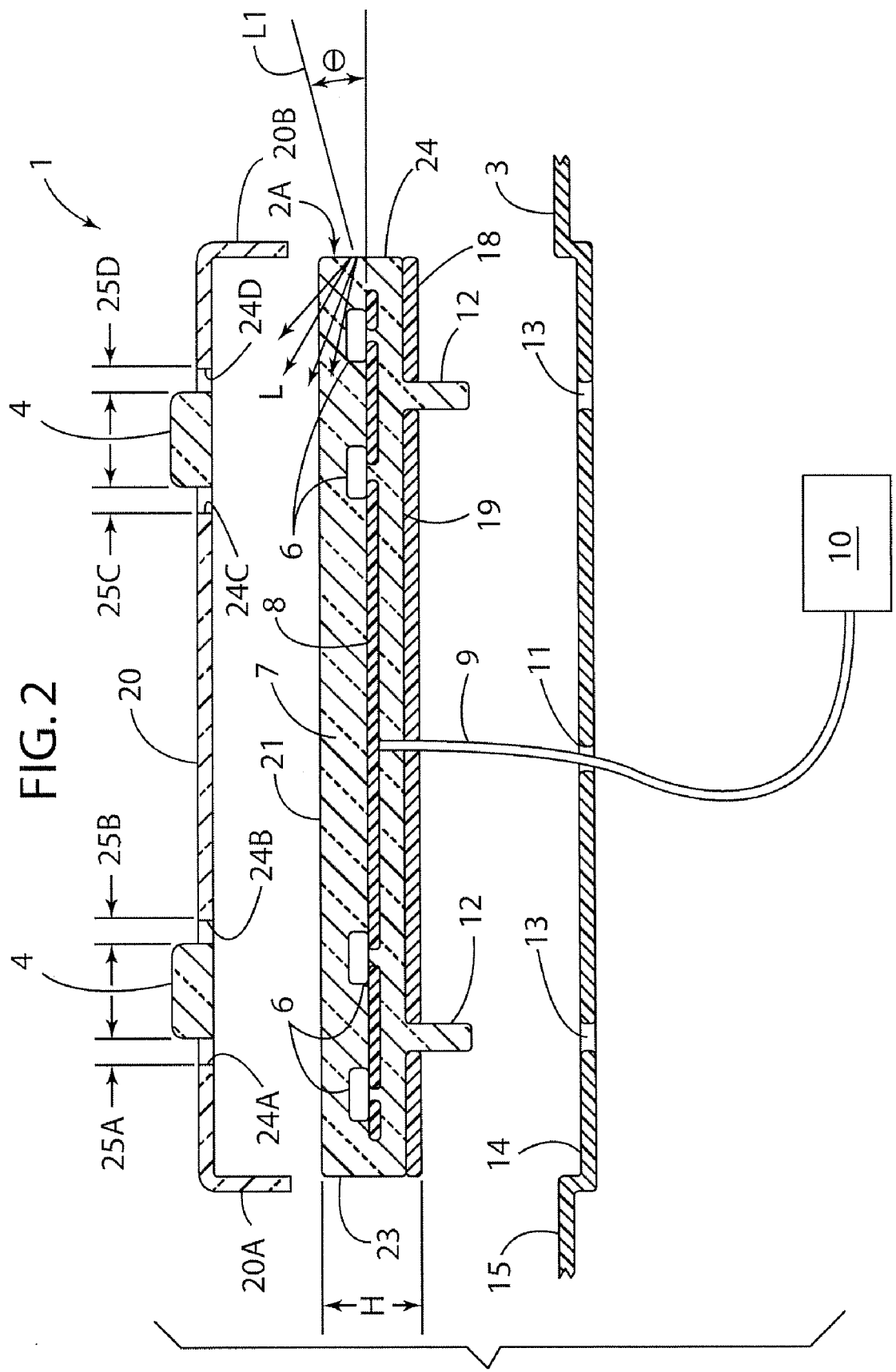
FIG. 2 is a fragmentary, partially exploded cross-sectional view taken along the line II-II.
Figure 3:
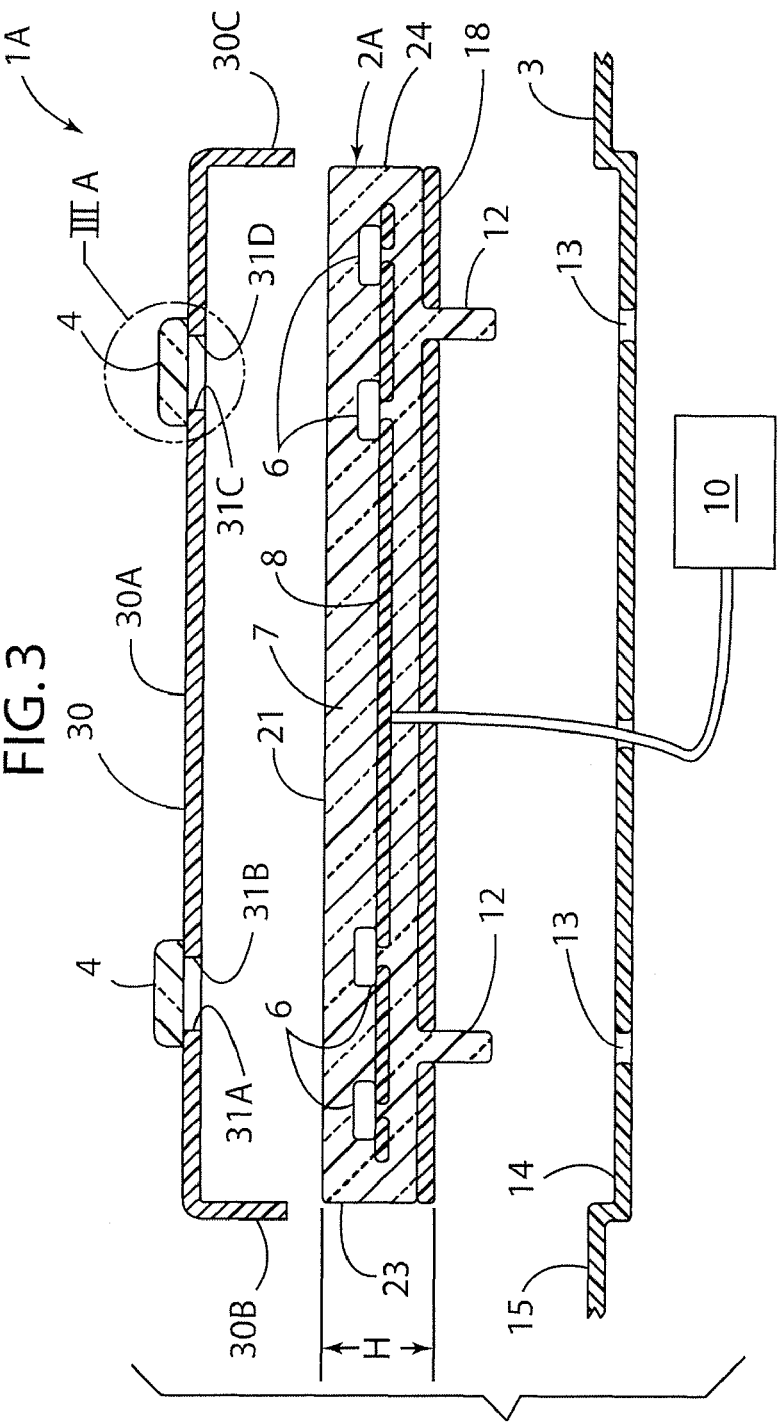
FIG. 3 is a partially exploded, fragmentary, cross-sectional view of a badge or emblem according to another aspect of the present invention.

For purposes of description herein, the terms "upper," "lower," "right," "left," "rear," "front," "vertical," "horizontal," and derivatives thereof shall relate to the invention as oriented in FIGS. 2-4. However, it is to be understood that the invention may assume various alternative orientations and step sequences, except where expressly specified to the contrary. It is also to be understood that the specific devices and processes illustrated in the attached drawings and described in the following specification are simply exemplary embodiments of the inventive concepts defined in the appended claims. Hence, specific dimensions and other physical characteristics relating to the embodiments disclosed herein are not to be considered as limiting, unless the claims expressly state otherwise.

Figure 1:
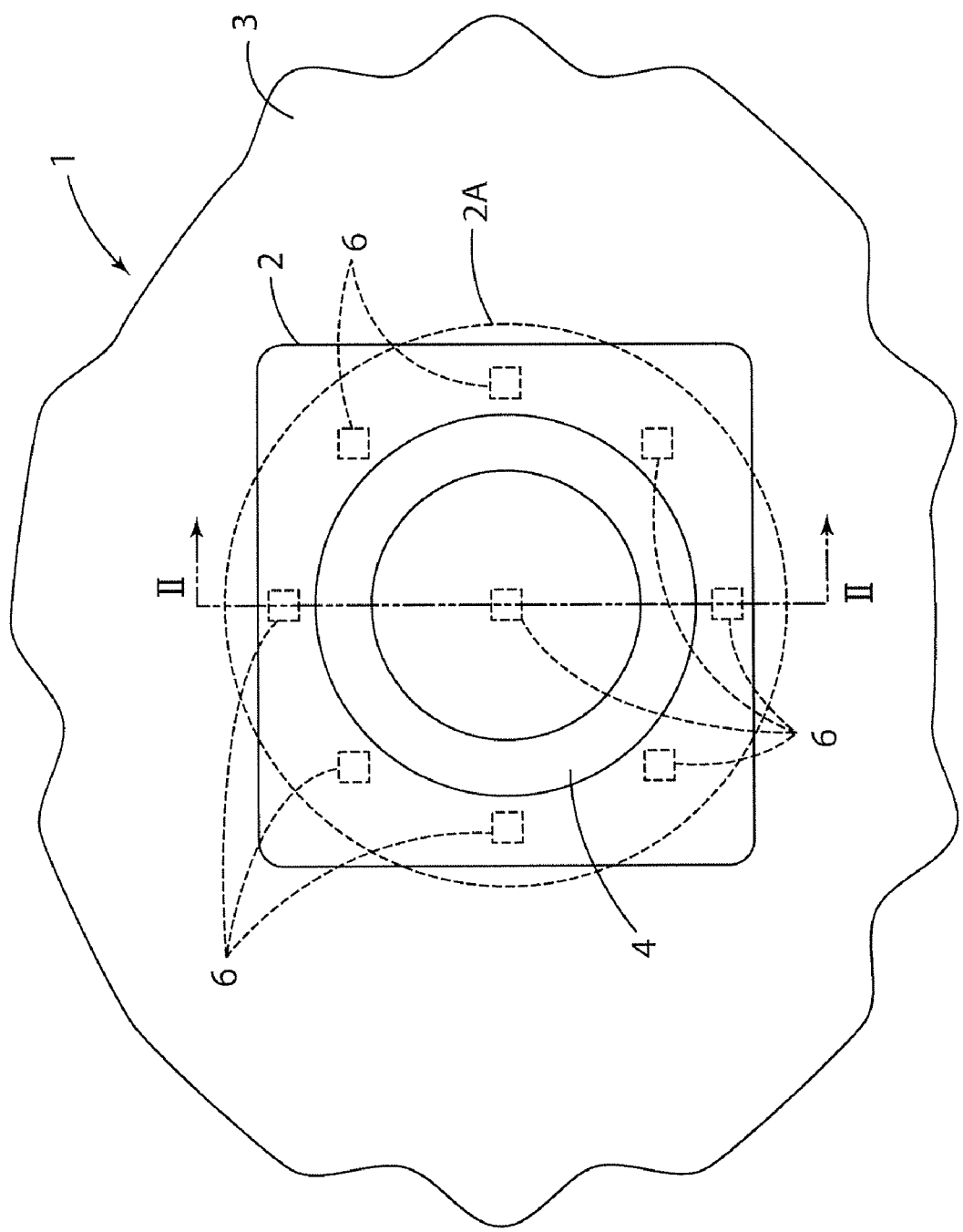
FIG. 1 is a partially fragmentary view of a badge or emblem installed to a vehicle or the like according to one aspect of the present invention.

With reference to FIG. 1, a lighted device such as a badge or emblem 1 according to one aspect of the present invention includes a base 2 that is secured to a structure 3, and an emblem or badge design 4. As discussed in more detail below, the structure 3 may be a sheet metal portion of a fender of a vehicle or the like, or it may comprise a back portion of a seat of a vehicle, or other mounting structure. In the illustrated example, the design 4 has a ring-like shape. It will be understood that the design 4 may comprise virtually any shape or design. In particular, the design 4 comprises a logo or trademark of an auto manufacturer or the like, such that the badge or emblem 1 readily identifies the make and/or model of the vehicle. Base 2 may be quadrilateral, or any other shape. For example, the base may be shaped to match or complement the shape of design 4 as shown by the dashed line 2A (FIG. 1). As also described in more detail below, the base 2 may include a plurality of LEDs 6 that provide for back lighting of the design 4.

With further reference to FIG. 2, a light device such as a badge or emblem 1 according to one aspect of the present invention includes a base 2A having a plurality of LEDs 6 embedded in light-transmitting polymer material 7. Polymer material 7 is preferably clear, but it may comprise a colored translucent material, or it may comprise other light-transmitting material. A conductor 8 embedded within the clear polymer material 7 supplies electrical power to the LEDs 6. One or more electrical power lines 9 are electrically connected to the conductor 8, and supply power from a power source 10. The electrical power lines 9 pass through an opening 11 in the structure 3. It will be understood that the power source 10 may include the necessary circuitry (not shown) to drive the LEDs 6 in addition to a conventional battery power source of the type utilized for vehicles and the like. Alternately, the circuit (not shown) for driving the LEDs may be positioned on conductor 8, and embedded in polymer material 7. The base 2A may be fabricated according to the arrangement disclosed in detail in U.S. Provisional Patent Application No. 60/838,982, entitled ELECTRICAL DEVICE HAVING BOARDLESS ELECTRICAL COMPONENT MOUNTING ARRANGEMENT, filed on Aug. 21, 2006, the entire contents of which are incorporated by reference.

The base 2A may include a pair of mounting/locating posts or bosses 12 formed from the clear polymer material 7. The posts or bosses 12 are received in openings 13 in structure 3 to locate the base 2A in the proper position on structure 3. The structure 3 may include an indentation or recessed area 14 that receives the base 2A to reduce the extent to which the badge or emblem 1 protrudes above the surface 15 of structure 3. It will be understood that the thickness or height "H" of the base 2A is typically quite small, in the range of about 3-6 mm. The thicknesses of the components of the base 2A are exaggerated in FIG. 2 for purposes of illustration. A layer of adhesive 18 on lower side 19 of base 2A secures the base 2A to the structure 3. In a preferred embodiment, the adhesive 18 is a pressure sensitive adhesive ("PSA"). However, other suitable adhesives or securing arrangements may also be utilized in accordance with the present invention.

The badge or emblem 1 of FIG. 2 includes a thin layer of material 20 that may be secured to a top surface 21 and to side surfaces 22 and 23 of clear polymer material 7. The thin layer of material 20 comprises film, paint, or other substantially opaque material that blocks light generated by LEDs 6. Layer 20 may be colored to provide the desired appearance for the badge or emblem 1. Edges 24A, 24B, 24C, and 24D of layer 20 are spaced apart from the material forming the design 4 to form gaps 25A, 25B, 25C, and 25D, respectively. The design 4 is preferably a solid member made of opaque plastic polymer, metal, or other suitable material that blocks light from LEDs 6 and provides the desired wear and appearance characteristics. The thin layer 20 and material of design 4 both block the light from the LEDs 6, such that the light can only escape through the gaps 25A-25D. This provides a unique edge lit arrangement that accents the design 4. In the illustrated example, the thin film 20 includes edge portions or flaps 20A and 20B that extend over the side surfaces 23 and 24, respectively, of the clear polymer material to thereby prevent escape of light from the LEDs 6 at the edge or side surface 23 and 24.

LEDs 6 are preferably side-emitting LEDs that would emit light sideways (e.g., parallel to conductor 8) if mounted flat on conductor 8. LEDs 6 are, however, preferably mounted to conductor 8 at an angle "θ" of about 30°. Also, LEDs 6 are oriented to emit light "L" towards side surfaces 23 and 24. Light L incident on side surfaces 23 and 24 is reflected inwardly back into polymer material 7. The line "L1" of FIG. 2 represents the path light from an LED 6 would travel if the light were not reflected intervally. Mounting LEDs 6 at an angle θ facilitates dispersion of the light from LEDs 6 within the polymer material 7 and avoids or reduces "hot spots" (areas of greater light intensity) that could otherwise be formed if the LEDs 6 were mounted in a flat configuration (i.e., θ=0°). Top surface 21 of polymer material 7 may be grained, frosted, or otherwise non-smooth to provide for dispersion (escape) of light from surface 21. Top surface 21 may have an irregular or rough surface in the areas of gaps 25A-25D to promote dispersion of light in these areas, and top surface 21 may be smooth in other areas to promote internal reflection of light L.

Because the LEDs 6 and conductors 8 are completely embedded within the clear polymer material 7, the badge or emblem 1 is completely or substantially waterproof, thereby providing a high degree of durability and weather resistance. Also, because the LEDs 6 draw a relatively low amount of electrical power, the badge or emblem 1 does not significantly effect the electrical power system of the vehicle. The badge or emblem 1 may be operably connected to a timer or the like that continues to light the LEDs 6 for a period of time after the vehicle ignition or other lights are turned off. In this way, a parked vehicle in a parking lot or the like having an emblem 1 will provide a unique lighted display of the badge or emblem even after the vehicle is turned off. Because the power requirements of the LEDs 6 are very low, the timer may be configured to leave the badge or emblem 1 on for a relatively long period of time, such as 10 minutes, 20 minutes, 30 minutes, or an hour or more. Thus, if the vehicle includes a timer that turns off the vehicle headlights and/or interior lights after a few minutes, the emblem 1 may remain illuminated for a substantially longer period of time.

Figure 3A:
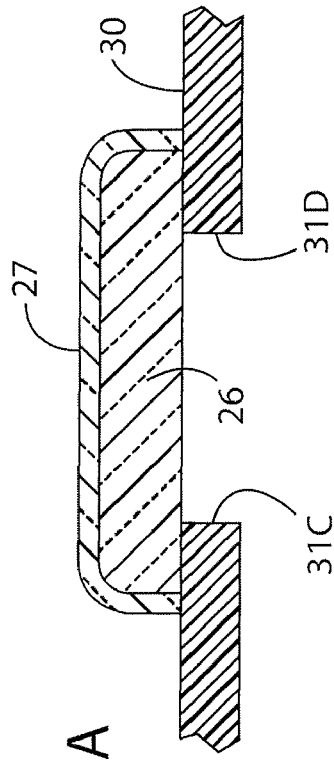
FIG. 3A is an enlarged view of a portion of the badge or emblem of FIG. 3.

With further reference to FIG. 3, a device such as a badge or emblem 1A according to another aspect of the present invention includes a base 2A having side-emitting LEDs 6 and a conductor 8 embedded in a clear polymer material 7 in substantially the same manner as illustrated in FIG. 2. LEDs 6 are mounted at an angle (i.e. not flat) as discussed above in connection with FIG. 2. However, unlike the badge or emblem 1 of FIG. 2, edges 31A, 31B, 31C and 31D of material 30 are positioned below the material forming the designs 4, such that no gap or the like is formed around the designs 4. Material 30 may be opaque paint, polymer, or other such material. With further reference to FIG. 3A, design 4 may comprise a light-transmitting or clear polymer material 26 with a thin layer of light-transmitting material 27 disposed over the polymer material 26. Layer 27 is a light-transmitting material that produces a chrome-like appearance when LEDs 6 are turned off. However, layer 27 transmits light and illuminates design 4 when LEDs 6 are turned on by transmitting light from LEDs 6 through layer 27. Layer 27 may be a LensLite® film that is commercially available from Craft Originators of Hamilton, Ontario, Canada. Layer 27 may comprise one or more layers of material as disclosed in U.S. Pat. No. 6,101,748, the entire contents of which are incorporated by reference. Alternately, layer 27 may comprise a light-transmitting layer that is translucent, a colored layer of polymer material or paint. Still further, layer 27 may be eliminated, and the polymer material 26 may comprise a colored translucent material providing a lighted design 4.

As discussed above, although the base 2 illustrated in FIG. 1 has a generally quadrilateral shape, the base of the badge or emblem 1 may be chosen to have a shape as shown by the dashed line designated 2A in FIG. 1 that complements the shape of the design 4. As also discussed above, the design 4 may have virtually any shape or configuration as required to properly identify the particular make or model of vehicle, or provide another desired decorative effect. Accordingly, the shapes illustrated in the present application for the design 4 and base 2 are merely for purposes of illustration to provide for understanding of the present invention, and are not to be construed to be limiting with respect to the shape of these components.

With further reference to FIG. 4, a badge or emblem 1B according to another aspect of the present invention includes one or more side-emitting LEDs 6 that are embedded in light-transmitting or clear polymer material 35. LEDs 6 are mounted at an angle (i.e. not flat) as discussed above in connection with FIG. 2. Electrical power is supplied to the LEDs 6 via a conductor 8. In addition to the clear polymer material 35, the badge or emblem 1B further includes a portion 36 made of a non-translucent polymer material such as a black ABS material. In the illustrated example, the portion 36 includes a main section 37 forming a layer adjacent the conductor 8, and upstanding edge or flange-like portions 38 and 39 that extend around the side surfaces 40 and 41, respectively of clear polymer material 35. Edge portions 38 and 39 prevent escape of light from LEDs 6 from the interfaces 40 and 41 formed where the non-translucent material 36 meets the clear polymer material 35.

Light from LEDs 6 is reflected inwardly at interfaces 40 and 41, and escapes through layers 50 embedded in a design or badge component 45. Design component 45 may be secured to a front surface 46 utilizing adhesive or the like (not shown) disposed on the lower surface 47 of the material forming the design 45. It will be understood that the design 45 may have a shape similar to the material forming design 4 of the badge or emblem 1 as illustrated in FIG. 1, or the material forming the design component 45 may have another shape as required for a particular application.

The badge or design 45 may have layers of material 50 embedded therein to form the design 4. More specifically, with reference to FIG. 5, the design or badge 45 may include a clear or translucent polymer body 51, with a thin layer of material 50 embedded in polymer body 51 to form logo or design 4. The layer of material 50 may be a LensLite® film described in aforementioned U.S. Pat. No. 6,101,748. It will be understood that the embossed layer 50 may actually comprise a plurality of layers as required to provide the desired effect. In a preferred embodiment, the layer 50 provides a chrome-like appearance when the design or badge 45 is viewed from the "A" surface. The layer 50 is embossed to provide a non-planar appearance. In the illustrated example, the layer 50 is embossed to a depth "H1" of about 1.5 mm, and the overall thickness "H2" of the badge 45 is about 3 mm. However, it will be understood that virtually any thickness may be utilized as required for a particular application. For example, layer 50 need not be embossed, and could comprise a flat layer or material. Clear or other light-transmitting polymer material 52 is disposed in the cavity 53 formed by the embossed layer 50. When light "L" from LEDs 6 is incident upon the clear polymer material 52, it is transmitted through the clear polymer material 52, the embossed layer 50, and through clear polymer material 51. The light L then escapes through outer surface 46 of polymer material 51.

First and second layers of paint or other opaque film 54 and 55 are disposed on the clear polymer material 51 in the areas surrounding the embossed layer 50 to block the transmission of light "L" from the LEDs 6. Layer 55 is preferably a layer of polymer material, black paint or the like that blocks the transmission of light. Layer 54 comprises a paint or other polymer layer that may be colored to provide the desired background color surrounding the chrome embossed layer 50. Pressure sensitive adhesive ("PSA") may be utilized to secure the design or badge 45 to the front side surface 46 of the clear polymer material 35 (FIG. 4) and the black polymer portion 36. Preferably, the PSA is not applied to the clear polymer material 52 so as not to block the transmission of light "L" through the embossed layer of material 50.

The light device or assembly/badge/emblem 1 of the present invention may be utilized on the exterior of vehicles, such as on a fender, bumper, or the like. Alternately, the light assembly 1 may be positioned, for example, on the back of a seat or the like. Still further, a light assembly 1 according to the present invention may be mounted to the exterior of a building, house, or other stationary structure to thereby provide for a decorative or informative effect.

With further reference to FIG. 6, a light assembly or device according to another aspect of the present invention comprises a vehicle component such as a doorsill assembly 60 having a primary structure 61 including an elongated flat portion 62, and an upwardly-extending channel portion 63. In use, a vehicle door (not shown) is positioned above the flat portion 62 of primary structure 61, and side surface 64 of channel portion 63 disposed directly adjacent, or in contact with, a lower edge portion (not shown) of the vehicle door. A light assembly 70 (see also FIG. 7) is mounted to the primary structure 61, and includes an upper surface 71 that is visible through an opening 66 in flat portion 62 of primary structure 61.

With reference to FIG. 7, light assembly 70 includes a light source/guide assembly 74, an upper member or appliqué 75 forming upper surface 71 a backing member 76, and an optional reflective layer or member 77.

The upper member 75 is made of a thin sheet of polycarbonate or other suitable polymer material having a thickness of about 1.0 mm to 2.0 mm. In the illustrated example, upper member 75 is about 1.5 mm thick. The upper member 75 may be made from a layer or sheet 80 of polymer material having light-transmitting properties, and ink 78 or other light-blocking material is applied to a lower surface 79 of the sheet of material 80, leaving areas 81 without ink 78, such that light from light source/guide assembly 74 may be transmitted through the areas 81. The areas 81 may form letters, designs, or the like. In particular, the areas 81 may form letters spelling out the brand or model of the vehicle that can be read by a user when the doors open to expose the lighted doorsill assembly 60 (FIG. 6). The areas 81 may also form designs or shapes other than letters, numbers, etc. The upper surface 71 of sheet 80 may comprise a protective coating of wear-resistant material to improve durability of the light assembly 70. One example of a suitable material for the coating or layer of surface 71 is SERIGLAZE® product available from Serigraph, Inc. of West Bend, Wis. The sheet 80 is preferably a clear or translucent material. In particular, the sheet 80 may comprise a white polymer material that provides sufficient light transmission capability to illuminate the areas 81, while simultaneously not permitting a user to view the light source/guide assembly 74 and/or vacuum member and reflective member 77 through the areas 81.

The light source/guide assembly 74 includes a light source 85 that is connected to a light guide 86 at a joint 87. Electrical lines 88 and 89 extend from the light source 86, and connect to a conventional 12 volt vehicle electrical power supply.

With further reference to FIG. 8, the light source/guide assembly 74 includes a light guide 86 and a light source assembly 85. The light guide 86 may be formed from a sheet of acrylic material or other suitable polymer having a relatively uniform thickness. The thickness of the light source 85 and light guide 86 will vary depending upon the requirements of a particular application. In the illustrated example, light source 85 and light guide 86 have a thickness in the range of about 2.0-4.0 mm, and more preferably about 3.0 mm. However, light source 85 and light guide 86 could have different thicknesses. In the illustrated example, the light guide 86 is cut from a large sheet of material to form a perimeter 91 including a recess such as inwardly-extending portion 92 with a surface 93 having a shape that closely corresponds to a protrusion 95 of light source assembly 85. The light guide 86 may be formed by laser-cutting, sawing, or otherwise cutting a sheet of polymer material. Alternately, the light guide 86 may be molded utilizing a suitable polymer material or the like. As described in more detail below, the light source assembly 85 includes one or more LEDs and other electrical components that are molded into polymer body 96. In the illustrated example, the light guide 86 comprises a rectangular prism, with the exception of the inwardly-extending portion 92. Light from the light source assembly 85 is reflected internally within the light guide 86, and subsequently escapes from the upper surface 97 and through the areas 81 (FIG. 7) of upper member 75.

The protrusion 95 of light source 85 is configured to be closely received within the recess or inwardly-extending portion 92 of perimeter 91 of light guide 86 to thereby mechanically and optically interconnect the light source assembly 85 and light guide 86. In the illustrated example, the protrusion 95 is generally T-shaped in plan view (FIG. 9), with a first portion 98, and transversely-extending portions 99 and 100. The inwardly-extending portion 92 of light guide 86 includes a first portion 101 corresponding to the first portion 98 of protrusion 95, and side portions 102 and 103 corresponding to transverse portions 99 and 100, respectively, of protrusion 95 of light source assembly 85. The protrusion 95 may be dimensioned slightly larger than the inwardly-extending portion 92 of perimeter 91 of light guide 86 to thereby form an interference fit to mechanically interconnect the light source assembly 85 to the light guide 86 without the use of adhesives.

Adhesive material (not shown) may optionally be applied to the protrusion 95 and/or inwardly-extending portion 92 immediately prior to assembly to provide for secure connection between the light source assembly 85 and light guide 86. Also, to ensure that the light source assembly 85 is optically coupled to the light guide 86, a small amount of light-transmitting material such as a clear sealant or adhesive material may also be applied to the protrusion 95 and/or inwardly-extending portion 82 of perimeter 91 at the time of assembly.

With further reference to FIGS. 9-11, light guide 86 includes irregular surface portions 106 that form a dispersion pattern that causes light from the light source assembly 84 to be dispersed within light guide 86 towards upper surface 97 of light guide 86, such that the light escapes from upper surface 97 of light guide 86. In the illustrated example, the outline 107 of the dispersion pattern 106 is in the form of letters having a shape that is substantially similar to the light-transmitting areas 81 (FIG. 7) of upper member 75. The dispersion pattern 106 may have the same size and shape as areas 81, or it may be somewhat larger or smaller. In general, the dispersion pattern 106 may be somewhat larger than the areas 81 to ensure that the areas 81 are fully illuminated, and has a similar shape to provide for efficient dispersion of light adjacent light-transmitting areas 81 of upper member 75. In the illustrated example, the dispersion pattern 106 is formed on lower surface 105 of light guide 86 by a laser. The dispersion pattern 106 comprises a plurality of small surface irregularities such as low spots, high spots, or a combination of both, produced by a laser incident upon the lower surface 105. It will be understood that the boundary line 107 is provided for purposes of illustrating the outline of the dispersion pattern 106 relative to the adjacent smooth portions 108 of lower surface 105 of light guide 86, but the dispersion pattern does not necessarily include an actual line 107 formed on light guide 86.

Figure 12:
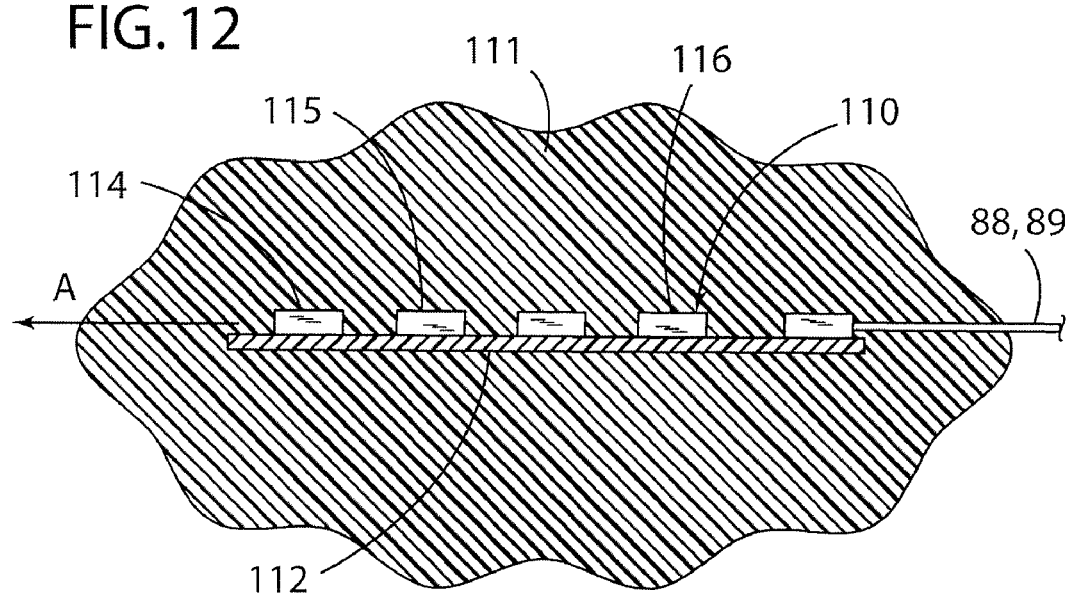
FIG. 12 is a fragmentary, enlarged view of a portion of the light source of FIG. 11 showing the internal electrical components.

With reference to FIG. 10, light source assembly 85 includes an internal electrical assembly 110 that is embedded in a polymer body 111. With further reference to FIG. 12, the electrical assembly 110 may include conductive circuit elements 112, and one or more electrical components 115, 116 such as resistors, diodes, capacitors, or the like that are soldered or otherwise electrically and/or mechanically connected to the circuit elements 112. In the illustrated example, the electrical components include a side-emitting LED 114 that is configured to emit light in the direction of the arrow "A", and one or more additional electrical components 115 and 116 that are also secured to the conductive elements 112. One or more conductive lines 88 and 89 supply power to the circuit elements 112, and extend outside of the polymer body 111. The side-emitting LED 114 and/or other electrical components 115, 116 may be secured to the circuit elements 112 and molded into the polymer body 111 according to the arrangement disclosed in U.S. patent application Ser. No. 11/842,606, entitled ELECTRICAL DEVICE HAVING BOARDLESS ELECTRICAL COMPONENT MOUNTING ARRANGEMENT, filed on Aug. 21, 2007, the entire contents of which are incorporated by reference.

Figure 13:
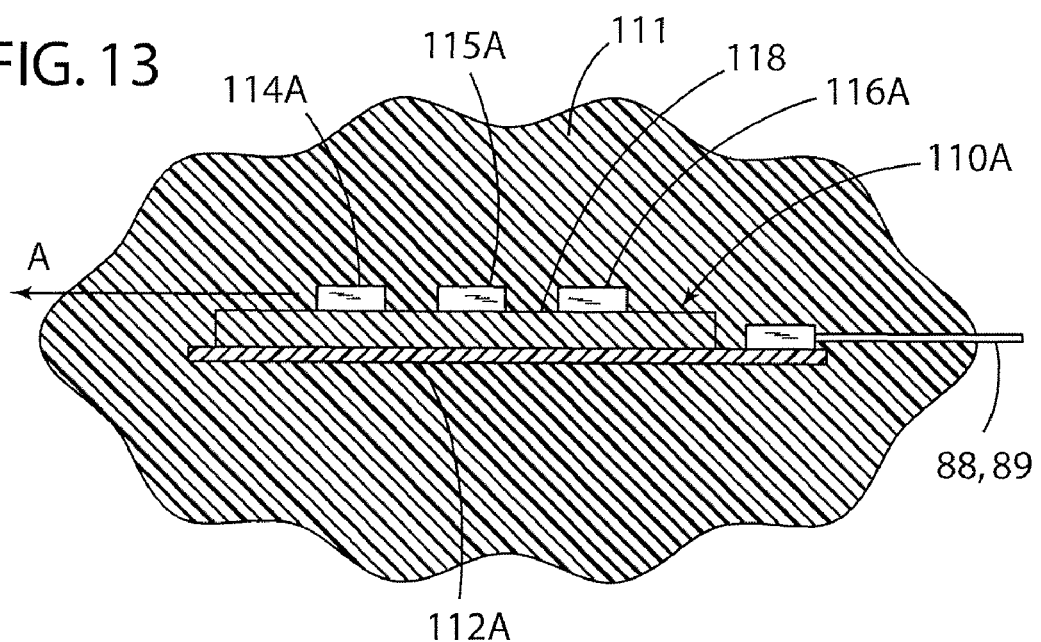
FIG. 13 is a fragmentary, cross-sectional view of a portion of a light source according to another aspect of the present invention.

With reference to FIG. 13, the light source assembly 85 may comprise an electrical assembly 110A having a printed circuit board 118 that is soldered or otherwise secured to circuit elements 112A, with a side-emitting LED 114A and other electrical components 115A and 116A being mounted to the printed circuit board 118. The electrical assembly 110A may be fabricated according to the arrangement disclosed in detail in U.S. Provisional Patent Application No. 61/013,097, entitled OVERMOLDED CIRCUIT BOARD AND METHOD, filed on Dec. 12, 2007, the entire contents of which are incorporated by reference. The LED 114A may comprise a red-green-blue ("RGB") LED configured to provide different colors as required for a particular application. Alternately, the RGB LED may be configured to change colors depending upon specific operating conditions (e.g. the ambient light level), such that the light assembly 70 (FIG. 6) provides a different color light under different operating conditions. The electrical components 115, 116 etc. are configured to drive the LED 114 (FIG. 12) or 114A (FIG. 13) when a conventional 12 volt D.C. power supply is connected to the lines 88 and 89. This permits the light assembly 70 to be connected to a conventional 12 volt vehicle power source (or other conventional power source). Although the light source 85 is illustrated as being supplied with power by electrical lines 88 and 89, it will be understood that the light source assembly 85 could be configured to include an electrical receptacle or the like to provide a plug-type connection as described in the above-identified application Ser. Nos. 11/842,606 and 61/013,097.

In the illustrated example, the LEDs 114/114A are positioned such that light from the LED 114 is generally transmitted/projected through the protrusion 95 (see also FIGS. 9 and 11) in the direction of the arrow "B". The light from the LED 114 is thereby transmitted into the light guide 86, such that the light is reflected internally until it escapes through the upper surface 97 of light guide 86. Alternately, the light source assembly 85 may include a pair of spaced-apart protrusions 95A and 95B (FIG. 9) that are received in corresponding inwardly-extending portions 92A and 92B, respectively, of light guide 86. If the light source 85 and light guide 86 are configured in this way, a flat surface 138 is formed on polymer body 111 of light source 85 that fits closely against a corresponding flat surface 139 on light guide 86, such that light from LED 114 is transmitted through the flat surfaces 138 and 139 of polymer body 111 and light guide 86, respectively.

Figure 14:
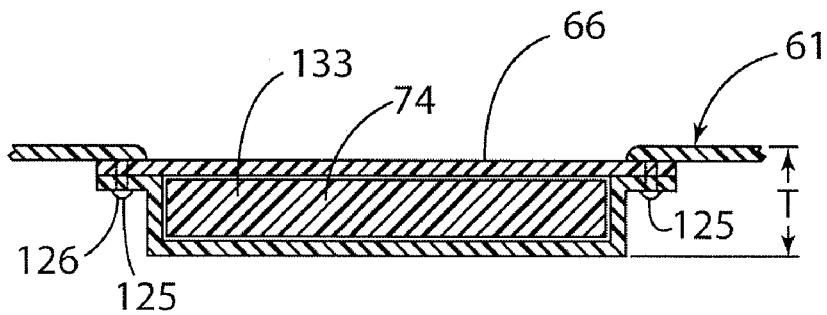
FIG. 14 is a fragmentary cross-sectional view of the lighted doorsill assembly of FIG. 6, taken along the line XIV-XIV.
Figure 15:
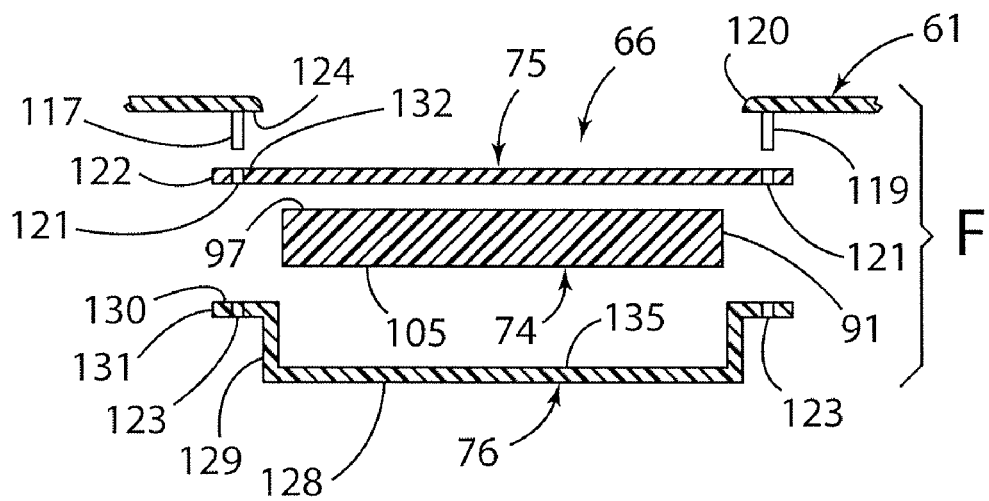
FIG. 15 is a fragmentary exploded view of the lighted doorsill assembly of FIG. 14.

With further reference to FIGS. 14 and 15, the primary structure 61 of lighted vehicle component or doorsill assembly 60 may be made of a polymer material, with posts 119 that extend downwardly adjacent edge 120 of opening 66. The upper member 75 includes a plurality of openings 121 adjacent the peripheral edge 122 of upper member 75, and backing member 76 includes a plurality of openings 123. During assembly, the posts 119 are inserted through the openings 121 of upper member 75, and through openings 123 of backing member 76, and the ends 125 (FIG. 14) of posts 119 are then melted to form an enlarged head or retainer portion 126 that physically interconnects the backing member 76 to the primary structure 61. The backing member 76 includes a main web 128, and a side wall or side web 129 that extends transverse relative to the base web 128. An outwardly extending flange portion 130 extends outwardly from the side web 129, and forms a peripheral edge 131. In the illustrated example, webs 128 and 129 have a thickness in the range of 0.10-0.20 mm and preferably about 0.15 mm. When the posts 119 of primary structure 61 are melted, the flange portion 130 of backing member 76 tightly clamps the outer edge portion 132 of upper member 75 between the flange 130 and the primary structure 61, thereby forming a water-tight seal. The primary structure 61, upper member 75, and backing member 76 together define a cavity 133, and the light source/guide assembly 74 is disposed within the cavity 133.

In addition to, or instead of, the posts 119, adhesive material, sealant, or the like may also be applied to the flange 130 of backing member 76, edge portions 132 of upper member 75, and/or edge surfaces 124 of primary structure 61 to adhesively interconnect the primary structure 61, upper member 75, and backing member 76 and/or to provide a water tight seal. In the illustrated example, the upper surface 97 and lower surface 105 of light source/guide assembly 74 are not adhesively connected to the upper member 75 or backing member 76, respectively. The perimeter surface 91 of light source/guide assembly 74 may also be free of adhesive material. Because the light source/guide assembly 74 is not adhesively bonded to these other components, the problems associated with light diffusion/degradation, or the like that could otherwise occur due to adhesively bonding the light source/guide assembly 74 to the other components is alleviated or eliminated.

The cavity 133 is thereby sealed to form a watertight cavity housing the light source/guide assembly. This provides an assembly that is durable and resistant to moisture-related degradation.

Figure 16:
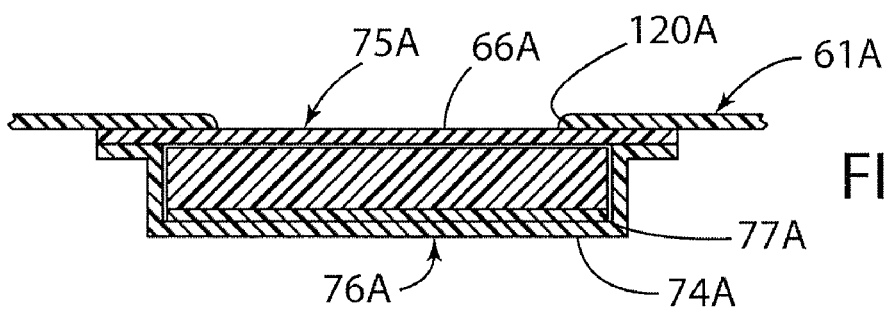
FIG. 16 is a cross-sectional view of another embodiment of the lighted doorsill assembly of FIG. 6.
Figure 17:
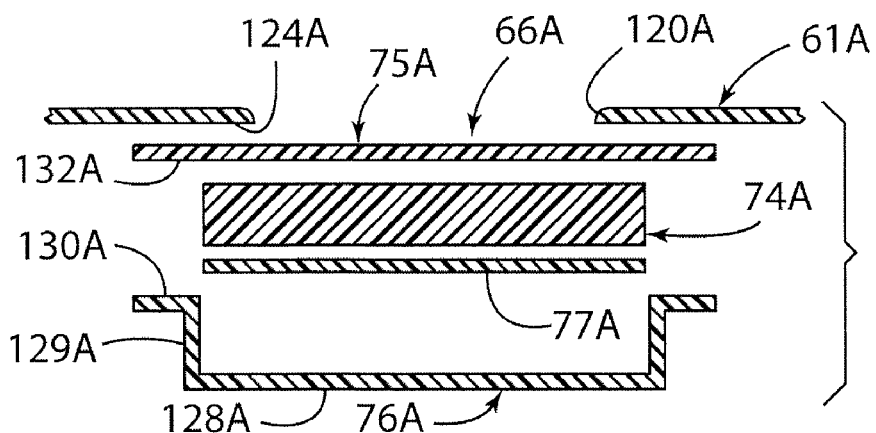
FIG. 17 is a fragmentary exploded view of the lighted doorsill assembly of FIG. 16.

In the illustrated example, the backing member 76 may be formed of an opaque polymer material that prevents escape of light from light source/guide assembly 74. Surface 135 of backing member 76 may comprise a layer of reflective material such as reflective ink, or a thin sheet of reflective material disposed on the main web 128 of backing member 76 to provide for increased reflection of light back into light guide 86 of light/guide assembly 74. With further reference to FIGS. 16 and 17, the light assembly may alternately comprise a backing member 76A having flange portions 130A that are adhesively bonded to edge portions 123A of upper member 75A. Similarly, the upper member 75A may be adhesively bonded to the edge surface portions 124A of primary structure 61A adjacent the peripheral edge 120 of opening 66A. A reflective member or layer 77A may be adhesively bonded to web 128A of backing member 76A to provide for increased reflection of light into light source/guide assembly 74A. The reflective member 77A may comprise a thin sheet of opaque polymer, such as a white polymer material having reflective qualities, and the backing member 76A may be made of an opaque, light-absorbing polymer material, such as a black polymer. The reflective member 77A may be adhesively bonded to the backing member 76A, or it may be integrally-formed with the backing member 76A utilizing an appropriate molding process.

In the illustrated example, the primary structure 61 has a thickness of about 1.0-2.0 mm, and preferably about 1.5 mm, in the vicinity of edge 120. Thus, in the illustrated example, the thickness "T" (FIG. 14) of the doorsill assembly 60 in the vicinity of light assembly 70 is about 5.0 mm. Also, in the illustrated example, light source/guide assembly 74 has a length "L" (FIG. 11) of about 40-50 mm, and a width "W" of about 15-25 mm. The main portion of body 111 of light source 85 is about 16-20 mm by 16-20 mm, and more specifically about 18 mm by about 18 mm (not including T-shaped protrusion 95).

With further reference to FIGS. 18 and 19, a lighted sill assembly 160 according to another aspect of the present invention includes a primary structure 161 that is substantially similar to the structure 61 described in more detail above in connection with FIG. 7. The primary structure 161 may be made of stainless steel or other suitable material, and it may be configured to form a portion of a scuff plate or door sill assembly of a motor vehicle. One or more designs or letters 168 may be formed in an upper surface 165 utilizing an etching liquid. In the illustrated example, the designs 168 are substantially black due to the action of the etching solution, and the upper surface 165 is silver. Etching solutions and processes for creating designs 168 on a stainless steel substrate are known, such that the details of the solution and process are not described in detail herein.

A sheet of polymer material 180 includes upper and lower surfaces 171 and 172, respectively. In the illustrated example, sheet 180 comprises a substantially clear or transparent polycarbonate material that is about 0.030 inches thick. A layer of ink 173 is disposed on lower surface 172. Ink 173 preferably comprises a commercially-available ink having a very high aluminum content, such that the ink 173 has a metallic silver appearance. Ink 173 is readily visible through upper surface 171 and the body of polymer sheet 180. Ink 173 may also comprise colored ink having colors other than silver if required for a particular application. Ink 173 is preferably substantially opaque such that light from light source 174 is not transmitted through ink 173 in areas 179 to a substantial degree. Thus, when light source 174 is turned on, only regions or areas 181 in which ink 173 has been removed are illuminated. Alternatively, ink 173 could have some light-transmitting properties when applied in a layer on lower surface 172 of sheet 180, but the amount of light transmitted through ink 173 is preferably significantly less than regions or areas 181, such that the letters, numbers, designs, or the like 181 are illuminated to a significantly greater degree than areas 179. As described in more detail below, ink 173 is removed in a selected pattern to form letters or designs 181 in first regions or areas, leaving second regions or areas 179 of lower surface 172 that are still covered by ink 173.

Lighted sill assembly 160 also includes a light source or guide assembly 174 having substantially the same construction as light source/guide assembly 74 described in more detail above in connection with FIGS. 7-11. Light source 174 includes a light source assembly 185 and a light guide 186. In general, light guide 186 may have a size and shape configured for a particular application (e.g. make/model of a motor vehicle), and LED light source assembly 185 may have a single configuration that can be readily interconnected to light guides 186 having different sizes/configurations. Electrical lines 188 and 189 provide electrical power for an LED embedded in light source 185. Light guide 186 may optionally include one or more dispersion patterns 106 as described in detail above in connection with FIGS. 9-11. A backing member 176 may have substantially the same configuration as the backing member 76 described in more detail above in connection with FIG. 7. Backing member 176 may include a reflective inner surface 177, or the lighted sill assembly 160 may include a reflective member that is substantially similar to the reflective member 77 of FIG. 7.

Lighted sill assembly 160 may optionally include a light-diffusing member 190. The light-diffusing member 190 comprises a thin layer of clear or transparent polymer material having a layer of white ink 191. White ink 191 may be disposed on upper surface 192 or on lower surface 193. The white ink 191 is preferably semi-translucent and permits a relatively high percentage of light produced by light source 174 to be transmitted through diffusing member 190. However, diffusing member 190 obscures light source 174 from direct viewing through areas 181 of sheet 180, such that the areas 181 of sheet 180 have substantially uniform illumination. In the illustrated example, light-diffusing member 190 comprises a sheet of clear or transparent polycarbonate material that is about 0.010 inches thick.

As discussed above, sheet 180 comprises a substantially transparent sheet of polymer material having opaque light-blocking ink 173 disposed on lower surface 172 of sheet 180. Member or sheet 180 may be fabricated from an enlarged sheet (e.g. 4 foot by 8 foot) of polymer material having ink 173 initially disposed on substantially the entire lower surface 172. The sheet can be cut to size from the larger sheet to form perimeter edge 182. The member 180 can then be positioned in a CNC-controlled laser-engraving or etching machine to etch away ink 173 to form areas 181. Removal of ink 173 in areas 181 utilizing laser-engraving results in a substantially smooth lower surface 172 that is free of ink 173, such that light from light source 174 is readily transmitted through sheet 180 in areas 181. Also, the laser-engraving process does not damage upper surface 171, such that light transmitted through the ink-free areas 181 is substantially uniform, without distortion, or other unsightly defects.

The CNC laser-engraving/etching machine (not shown) utilized to produce the ink-free areas 181 of sheet 180 may be of a known design. The laser-engraving/etching machine may comprise a known laser-engraving machine available from Epilog Laser of Golden, Colo. Significantly, the areas 181 may be custom made for a particular application based on an electronic design or the like. For example, a customer may order a lighted sill assembly 160 having a specific design 181 including the customer's name or other design. The customer may transmit a digital image/file from a PC or the like from a remote location to a processing/fabricating facility at which the digital image is utilize to program the CNC laser-engraving machine. The digital file/image received from the customer may be edited to form a digital file in a format that can be used by the laser-engraving/etching machine. For example, Corel DRAW graphics editing software available from Corel Corporation of Ottawa, Canada may be utilized to create a digital file having a format that can be used by the laser-engraving/etching machine. The process can be utilized to custom-make sheets 180 having unique designs 181 according to a particular customer's request/order. For example, areas 181 may comprise the customer's name, a phrase or slogan chosen by the customer, or a specific design specified by an individual customer. The CNC laser-engraving machine can be utilized to remove the ink 173 to provide the specified pattern or design 181 for a particular customer. A relatively large number of blanks to be made into member 180 may be precut to have a specified edge 182, and the individual blanks may then be positioned in the CNC laser-engraving machine to form custom lettering or designs 181 on an as-needed basis.

Also, an enlarged sheet (e.g. 4 foot by 8 foot) may initially be cut into smaller blanks that are somewhat larger than the finished member/sheet 180, and the blank can be positioned in a laser-engraving/etching machine. The laser-engraving/etching machine then forms areas 181 and cuts the blanks to form finished edge 182. For example, a 4 foot by 8 foot sheet of polymer material with ink 173 on one side surface could initially be cut into a plurality of blanks that are about 16 inches by 24 inches, and the blanks may be loaded into a laser-engraving/etching machine to etch areas 181 and cut the blank to its final size/shape. In this way, the finished edge 182 can be accurately cut to the proper size/shape for a particular application (e.g. make/model of motor vehicle) in the laser-engraving/etching machine.

During the laser-engraving process, air may be circulated over the upper and lower surfaces 171 and 172 of sheet 180 to remove gases produced by the laser-engraving process, and to cool the surfaces to prevent damage to the surfaces of sheet 180. The areas 181 generally comprise exposed polymer material that is substantially flat and free of surface irregularities or other defects that could otherwise cause non-uniform illumination/appearance in areas 181. Custom designs 168 may similarly be etched into upper surface 165 of primary structure 161.

According to another aspect of the present invention, the sill assembly 160 may be non-illuminated. If sill assembly 160 is non-illuminated, a spacer of polymer or other suitable material having external dimensions that are substantially similar to light source 174 is positioned in backing member 176 instead of light source 174. In the non-illuminated version of sill assembly 160, member 180 includes areas 181 that have had ink 173 removed by a laser-engraving/etching process that is substantially identical to the process described above. In the non-illuminated version of sill assembly 160, member 190 may comprise an opaque layer of colored material or an ink-coated sheet of material, whereby portions of the upper surface of member 190 are visible through areas 181 of member 180 to provide colored lettering, designs, or the like. Also, a decal 194 having an adhesive-coated upper surface 195 may be adhered to lower surface 172 of member 180, such that decal 194 is visible through areas 181 of member 180. Upper surface 195 of decal 194 may include multi-color printed designs or the like that are visible through areas 181 of member 180. If sill assembly 160 includes a decal 194, areas 181 may comprise a single area in the shape of, for example, a rectangle, circle, oval, or the like corresponding to decal 194 to provide for visibility of decal 194 through sheet member 180.

In the foregoing description, it will be readily appreciated by those skilled in the art that modifications may be made to the invention without departing from the concepts disclosed herein. Such modifications are to be considered as included in the following claims, unless these claims by their language expressly state otherwise. Unless expressly stated otherwise, features of one embodiment or version of the present application are not mutually exclusive with respect to other embodiments or versions of the invention.

The invention claimed is:

1. A method of fabricating an illuminated vehicle component, the method comprising:
    providing a sheet of light-transmitting polymer material having opposite side surfaces;
    coating at least a portion of a first opposite side surface of the sheet of light-transmitting material with a substantially opaque material;
    cutting the sheet of light-transmitting material to form a member having a peripheral edge having a predefined contour; and
    removing at least a portion of the opaque material utilizing a laser such that the first opposite side surface includes a first region that is coated with the opaque material and a second region wherein the opaque material has been removed.

2. The method of claim 1, wherein:
    the sheet of light-transmitting material is cut to form the peripheral edge after removal of at least a portion of the opaque material.

3. The method of claim 1, wherein:
    the sheet of light-transmitting material is cut to form a peripheral edge after at least a first opposite side surface of the sheet of light-transmitting material is coated with a substantially opaque material.

4. The method of claim 1, including:
    providing a light source having a generally planar light-emitting surface; and
    positioning the planar light-emitting surface adjacent the member such that light from the light source is transmitted through the second region of the member.

5. The method of claim 4, wherein:
    the second region has a shape forming a letter.

6. The method of claim 4, including:
    providing a layer of light-diffusing material; and
    positioning the layer of light-diffusing material between the light source and the member.

7. The method of claim 4, including:
mounting the light source and the member to a motor vehicle along a lower edge of a door opening whereby the light source and the member define at least a portion of a scuff plate.

8. The method of claim 1, including:
providing a laser-engraving machine;
receiving a digital file defining a design having a shape from a customer at a remote location;
positioning the sheet of light-transmitting material in the laser-engraving machine; and
causing the laser-engraving machine to remove the opaque material such that the second region has a shape that is substantially the same as the shape of the design.

9. The method of claim 1, including:
providing a decal having a design printed on a first side thereof; and
positioning the decal adjacent the first opposite side of the sheet of light-transmitting polymer material such that at least a portion of the design is visible through the second region.

10. The method of claim 9, wherein:
the decal is adhesively secured to the first opposite side of the sheet of light-transmitting polymer material.

11. A light assembly, comprising:
an electrically conductive circuit;
at least one LED mounted to the circuit; a light-transmitting thermoplastic polymer body encapsulating the LED and at least a portion of the circuit and defining inner and outer side faces, wherein the polymer body includes smooth surface portions configured to internally reflect light from the LED, and irregular surface portions that disperse light from the LED such that the light from the LED escapes from the polymer body;
a layer of substantially opaque material disposed on the outer side face of the polymer body and covering selected portions of the outer side face and substantially blocking escape of light from the polymer body at the selected portions, the layer of substantially opaque material defining open areas on the outer side face of the polymer body, wherein the open areas are illuminated by light from the LED and form a lighted pattern.

12. The light assembly of claim 11, wherein:
the open areas are formed by openings through the layer of substantially opaque material.

13. The light assembly of claim 12, including:
at least one opaque member disposed in a selected one of the openings through the layer of substantially opaque material and defining a gap between the opaque member and the edge of the one opening through which light can escape.

14. The light assembly of claim 12, including:
a light-transmitting member extending over at least one of the openings and closing off the opening.

15. The light assembly of claim 14, wherein:
the light-transmitting member includes a polymer body portion and a layer of light-transmitting material disposed on the body portion, wherein the layer of light-transmitting material has an appearance that is substantially similar to chrome when the LEDs are turned off.

16. The light assembly of claim 11, including:
a timer that turns off the LEDs after a preselected period of time.

\* \* \* \* \*